United States Patent [19]

Bunshah et al.

[11] Patent Number: 4,931,158

[45] Date of Patent: Jun. 5, 1990

[54] DEPOSITION OF FILMS ONTO LARGE AREA SUBSTRATES USING MODIFIED REACTIVE MAGNETRON SPUTTERING

[75] Inventors: Rointan F. Bunshah, Playa del Rey; Chandra V. Deshpandey, Los Angeles; Aziz A. Karim, Santa Monica, all of Calif.

[73] Assignee: The Regents of the Univ. of Calif., Oakland, Calif.

[21] Appl. No.: 391,740

[22] Filed: Aug. 8, 1989

Related U.S. Application Data

[63] Continuation of Ser. No. 171,789, Mar. 22, 1988, abandoned.

[51] Int. Cl.$^5$ .............................................. C23C 14/34
[52] U.S. Cl. ........................ 204/192.29; 204/192.12; 204/298.06; 204/298.11; 204/298.19
[58] Field of Search ................. 204/192.12, 192.14, 204/192.29, 298 TT

[56] References Cited

U.S. PATENT DOCUMENTS

| | | | |
|---|---|---|---|
| 3,477,936 | 11/1969 | Gillery et al. | 204/192.29 |
| 3,506,556 | 4/1970 | Gillery et al. | 204/192.29 |
| 3,528,906 | 9/1970 | Cash, Jr. et al. | 204/298 |
| 4,022,947 | 5/1977 | Grubb et al. | 428/432 |
| 4,234,654 | 11/1980 | Yatabe et al. | 428/333 |
| 4,248,687 | 2/1981 | Fan | 204/192.11 |
| 4,320,169 | 3/1982 | Yatabe et al. | 428/333 |
| 4,392,931 | 7/1983 | Maniv et al. | 204/192.12 |
| 4,395,323 | 7/1983 | Denton et al. | 204/298 |
| 4,426,275 | 1/1984 | Meckel et al. | 204/298 |
| 4,428,810 | 1/1984 | Webb et al. | 204/192.29 |
| 4,488,956 | 12/1984 | Scherer et al. | 204/298 |
| 4,534,841 | 8/1985 | Hartig et al. | 204/192.27 |
| 4,572,842 | 2/1986 | Dietrich et al. | 427/39 |
| 4,619,755 | 10/1986 | Hessberger et al. | 204/298 |
| 4,717,462 | 1/1988 | Homma et al. | 204/298 |

FOREIGN PATENT DOCUMENTS 142658 7/1980 German Democratic Rep. ............................. 204/298 TT

OTHER PUBLICATIONS

M. Scherer and P. Wirz, "Reactive High Rate D.C. Sputtering of Oxides", *Thin Solid Films*, 119 (1984), pp. 203–209.

S. Maniv, C. J. Miner, and W. D. Westwood, "Transparent Coducting Zinc Oxide and Indium–Tin Oxide Films Prepared by Modified Reactive Planar Magnetron Sputtering", *J. Vac. Sci. Technol.*, A 1 (3), Jul.–Sep. 1983, pp. 1370–1375.

S. Maniv, C. Miner, and W. D. Westwood, "High Rate Deposition of Transparent Conducting Films by Modified Reactive Planar Magnetron Sputtering of $Cd_2Sn$ Alloy", *J. Vac. Sci. Technol.*, vol. 18, No. 2, Mar. 1981, pp. 195–198.

A. A. Karim, C. Deshpandey, H. J. Doerr and R. F. Bunshah, "High Rate Deposition of Tin–Doped Indium Oxide Films by a Modified Reactive Magnetron Sputtering Process", *Thin Solid Films*, 153 (1987).

*Primary Examiner*—Aaron Weisstuch
*Attorney, Agent, or Firm*—Poms, Smith, Lande & Rose

[57] ABSTRACT

An apparatus and process for reactive magnetron sputtering wherein film deposition is controlled by placing a grid located over the primary plasma and an auxiliary plasma adjacent to the substrate. The auxiliary plasma is produced using a positively biased d.c. probe. Control of the deposited film properties is provided by varying the d.c. probe voltage and open area of the wire grid.

16 Claims, 3 Drawing Sheets

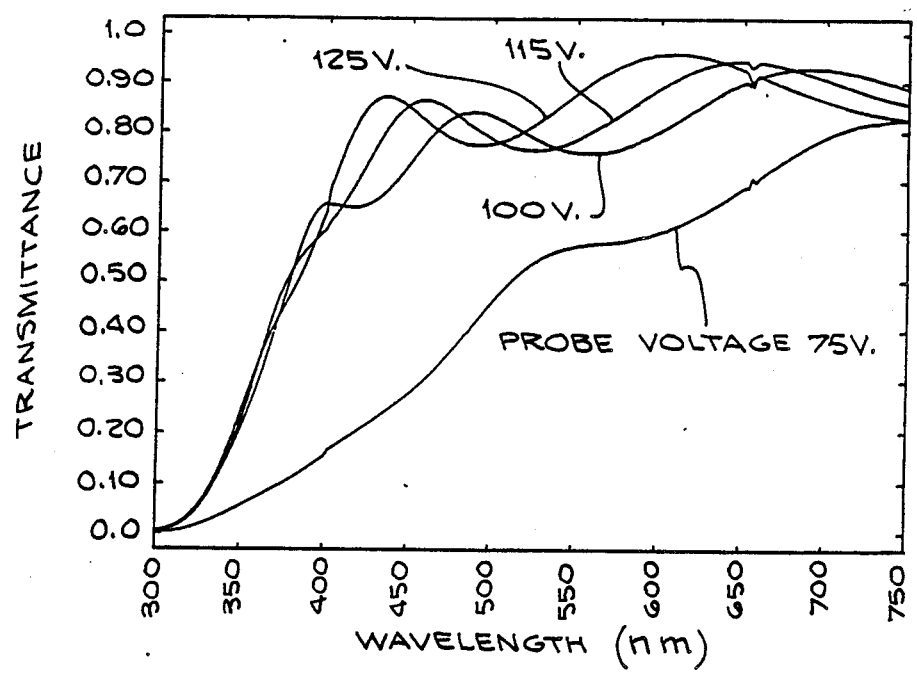
Fig. 2. EFFECT OF PROBE VOLTAGE
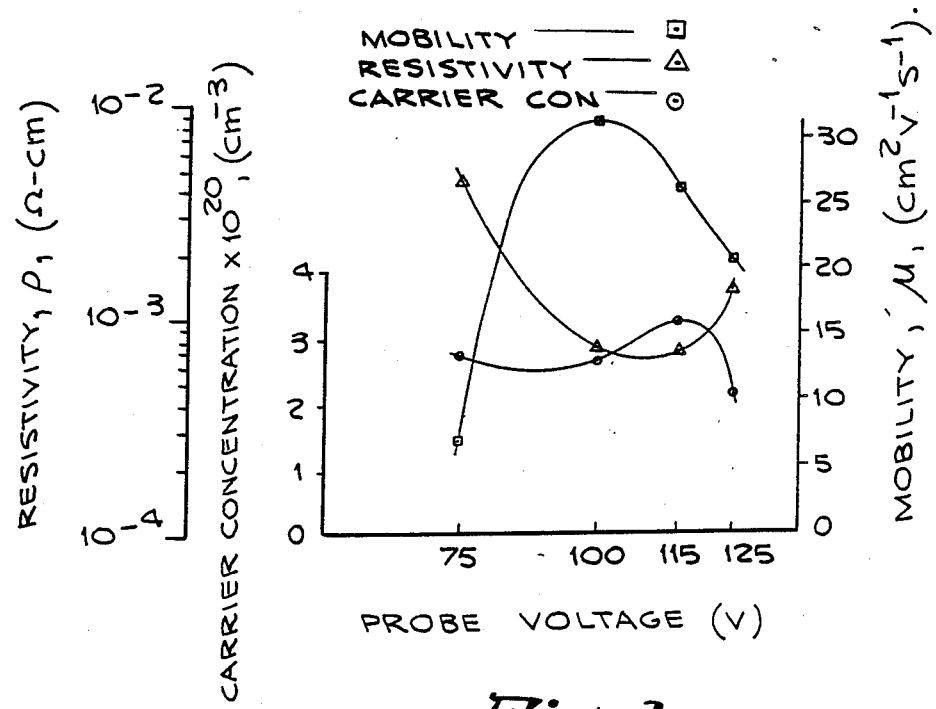
Fig. 3.

DEPOSITION OF FILMS ONTO LARGE AREA SUBSTRATES USING MODIFIED REACTIVE MAGNETRON SPUTTERING

This is a continuation of copending application(s) Ser. No. 07/171,789 filed on Mar. 22, 1988, now abandoned.

BACKGROUND OF THE INVENTION

1. Field of the Invention

This invention relates to processes for depositing films onto substrates by reactive magnetron sputtering. More specifically it relates to deposition of these films at high rates over large areas at low temperatures.

2. Description of the Background Art

The publications and other reference materials referred to herein to describe the background of the invention and to provide additional detail regarding its practice are hereby incorporated by reference. For convenience, the reference materials are numerically referenced and grouped in the appended bibliography.

Transparent conducting films have been extensively used in a variety of electronic and optoelectronic industries.[1] Stringent requirements on optical transparency (i.e. greater than 85% transmission) and electrical resistivity ($\rho$ of approximately $10^{-4}$ ohm-cm) for many specific optoelectronic applications has led to considerable research in the past decade towards development of new materials based on non-stoichiometric oxides of tin, indium, cadmium, zinc and their alloys as well as suitable techniques for synthesizing such coatings.

Many techniques such as chemical vapor deposition[2], spray pyrolysis[3], reactive[4] as well as activated reactive evaporation[5], sputtering[6], and reactive sputtering[7] have been used. Although many of the above techniques have produced excellent films, a suitable process for synthesis of such films onto large area substrates at relatively low substrate temperatures has not been developed.

Due to difficulties encountered in sputtering from an oxide target, such as physical cracking of the target, inability to control target surface composition, etc., a simple process based on reactive magnetron sputtering from a metallic target has been explored by a number of researchers. Although conventional reactive magnetron sputtering has been used successfully to deposit transparent conducting films of indium tin Oxide, difficulties are encountered in this process as regards to the deposition rate and run-to-run reproducibility of the film properties. The above difficulties stem from the inevitable "poisoning" of the target due to the formation of an oxide layer on the target's surface during reactive sputtering of the respective metal in the oxygen containing plasma.

The "poisoning" of the target depends in complex manner on deposition parameters such as target power, flow rate and partial pressure of the reactive gas, etc.[8,9,10]. The narrow operating window within which the target can be maintained in an unoxidized surface condition and yet deposit an oxide coating makes it extremely difficult to adopt conventional reactive magnetron sputtering for the synthesis of oxide films for industrial applications.

A number of modifications have been proposed to alleviate the above problems associated with the "poisoning" of the target during reactive magnetron sputtering from metallic targets. All such modifications are aimed at reducing the oxygen partial pressure in the vicinity of the target by using gettering surfaces[11] and/or geometrical baffles around the target[12]. The use of an r.f. substrate bias in conjunction with the above arrangements has also been explored.[13,14].

Although the above modifications have proven to be successful in reducing the target poisoning, they suffer from limitations as regards to their application for deposition onto large area substrates. The major limitations are: (1) Poor target utilization—only a fraction of the material is deposited on the substrate. (2) The use of geometric baffles limits the area of the substrate that is coated. (3) In most of the above configurations, target/substrates distances are very small: 3-5 inches. This leads to difficulties in obtaining thickness uniformity over large substrate areas. Also, a small target/substrate spacing imposes limitations when complex shape substrates need to be coated.

In view of the above limitations of the existing reactive magnetron sputtering technique for synthesis of transparent conducting coatings, there is presently a need to provide further changes in the basic process so as to establish a suitable technique that can be used for the synthesis of good quality transparent conducting coatings onto large area, heat sensitive substrates for industrial applications. For example, a heat sensitive substrate is a polymer which degrades at relatively low temperatures, such as 80° C.

SUMMARY OF THE INVENTION

In accordance with the present invention, a modified reactive magnetron sputtering apparatus and process is disclosed which provides for synthesis of good quality transparent conducting coatings onto large area, heat sensitive substrates.

The present invention involves producing two distinct plasma zones when carrying out the reactive sputtering process. One of the plasma zones is a primary plasma localized over the magnetron target material. The other plasma is an auxiliary plasma localized near the substrate to control the growth and properties of the deposited film. The primary plasma is surrounded by a container having a sidewall which defines a mini-chamber having an open top and an open bottom over the target material. A wire grid having a pre-selected open area is placed across the top of the mini-chamber for controlling the flow of sputtered material from the primary plasma toward the substrate. A positively biased direct current (d.c.) probe is used to generate the auxiliary plasma adjacent to the substrate.

In accordance with the present invention, the deposited film stoichiometry and other properties can be controlled by varying the d.c. probe voltage and varying the open area of the wire grid. The combination of a d.c. probe used to produce an auxiliary plasma along with a wire grid of suitable open area makes it possible to obtain excellent control over a wide range of film properties while not adversely affecting the deposition rate. The grid also reduces poisoning of the target by the reactive gas.

The discovery of the relationship between deposited film properties and the d.c. probe voltage and percent open area of the wire grid makes it possible to control and optimize the properties of the deposited film over a wide substrate surface area. Further, the process can be carried out at low temperatures (i.e. below 50° C.) and is amenable to coating relatively large substrates.

The wire mesh provides an effective array of sputtered material point sources and thus the substrate is exposed to fluxes from the entire area of the target which enables one to coat large area substrates without having to move them.

The above-discussed and many other features and attendant advantages of the present invention will become apparent as the invention becomes better understood by reference to the following detailed description when considered in conjunction with the accompanying drawings.

BRIEF DESCRIPTION OF THE DRAWING

FIG. 2 depicts the effect of d.c. probe voltage on the transmission of the deposited film when used in combination with a wire grid having an open area of 33 percent.

FIG. 3 depicts the effect of d.c. probe voltage on other properties of the deposited film with a grid open area of 33 percent.

DETAILED DESCRIPTION OF THE INVENTION

Figure 1:
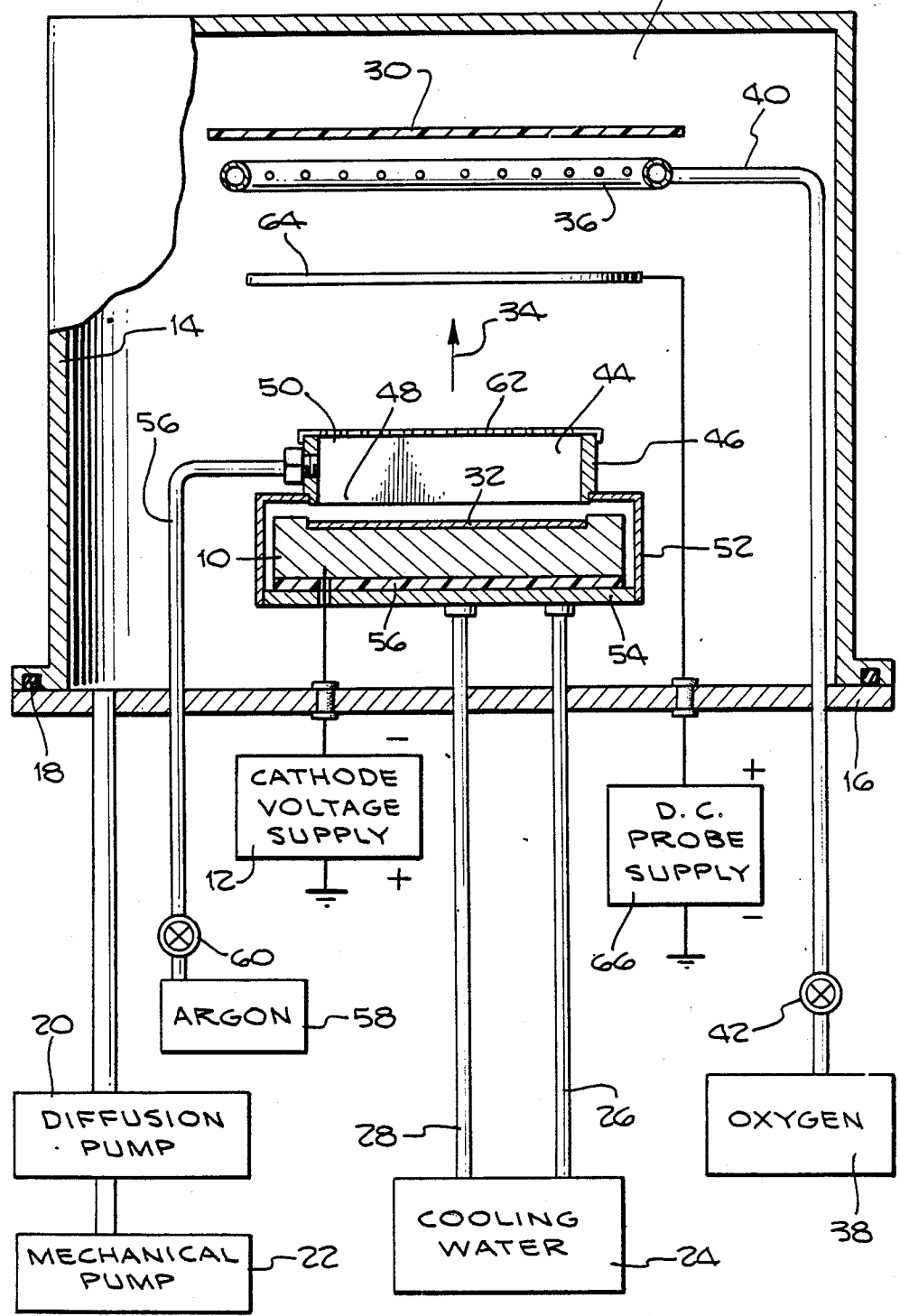
FIG. 1 is a schematic vertical section view of a vacuum chamber and the associated apparatus for performing reactive magnetron sputtering in accordance with the present invention.

A preferred exemplary apparatus in accordance with the present invention is shown schematically in FIG. 1. The apparatus is designed to conduct reactive magnetron sputtering of a wide variety of materials. The materials which can be sputtered include tin, indium, cadmium, zinc, aluminum, titanium and their alloys. The following description will be limited to the reactive magnetron sputtering of an alloy of tin and indium to produce coatings of indium tin oxide on given substrates, with it being understood that the apparatus may be used for reactive magnetron sputtering of any of the known material which are amenable to this film formation technique.

The exemplary reactive magnetron sputtering apparatus shown in FIG. 1 includes a conventional magnetron sputtering cathode 10. The magnetron sputtering cathode 10 is powered by a conventional cathode voltage supply 12. A stainless steel bell jar 14 or other suitable vacuum container is provided in order to achieve the necessary vacuum for conducting reactive magnetron sputtering. The bell jar 14 is mounted on apparatus table 16. O-ring 18 provides the necessary seal between the apparatus table 16 and bell jar 14 in order to maintain the desired vacuum. A diffusion pump 20 backed by a mechanical pump 22 maintains the necessary vacuum in the sputtering chamber 23. Cooling water is supplied to the magnetron sputtering cathode 10 from cooling water reservoir 24 via transfer lines 26 and 28. All of the above-discussed elements are conventional elements which are commonly used in reactive magnetron sputtering and form no part of the invention.

The substrate 30 to be coated is suspended above the magnetron sputtering cathode 10 by suitable support structures (not shown). The target material to be sputtered is placed onto the magnetron sputtering cathode 10 as a thin layer of material 32. During conventional sputtering processes, the target material 32 is activated to form a plasma that emits sputtered material which travels toward the substrate 30 as depicted by arrow 34.

As is conventionally known in reactive magnetron sputtering, a source of reactive gas is delivered adjacent to the substrate 30 by way of a manifold 36 or other suitable gas dispersion device. In the exemplary embodiment, the reactive gas is oxygen which is supplied from an oxygen reservoir 38 through line 40 to manifold 36. Other reactive gases can be used depending upon the desired deposition product. Suitable reactive gases in addition to oxygen include: nitrogen, halide gases including fluorine; silanes; germanes; phosphine; sulfur containing gases including hydrogen sulfide; and hydrocarbon gases. The control of oxygen flow to manifold 36 is provided by valve 42.

In accordance with the present invention, a mini-chamber 44 is formed directly over the target material. The mini-chamber 44 is bounded by sidewall 46. The sidewall 46 may be in the shape of a cylinder, square box or other polygonal shape provided that it surrounds the underlying target material 32. Preferably, the sidewall will be shaped to provide a cylindrical mini-chamber. The mini-chamber 44 has an open bottom 48 and an open top 50. The sidewall 46 is mounted on a ground shield 52. The ground shield 52 is mounted to a base support 54 which is in turn grounded by the water cooling transmission lines 26 and 28 or some other suitable grounding element. The magnetron sputtering cathode 10 is separated from the base support plate 54 by an insulating layer 56. Argon or other suitable inert gas is introduced into the mini-chamber 44 through line 56. The flow of gas through line 56 from gas reservoir 58 is controlled by valve 60.

In accordance with the present invention, a wire grid 62 is placed over the open top of mini-chamber 48. The wire grid is preferably made from a suitable material which has a low sputtering yield and is resistant to degradation when placed in close proximity to the sputtering plasma present in mini-chamber 44. Preferred wire materials are stainless steel and other related metal alloys having properties similar to stainless steel. The grid must be placed slightly above the sputtering plasma to prevent the grid openings from being clogged. Typically, the grid is placed about one inch from the target material. The grid wires should be less than 0.02 inch in diameter with 0.018 inch being preferred. The grid pattern is preferably a woven perpendicular grid pattern. Other grid patterns are possible provided that certain grid open area requirements are met. The open area of the grid must be between 20 to 45 percent. Clogging of the grid occurs when the open area is below 20 percent. On the other hand, when grid open area is above 45 percent, target poisoning becomes a problem. The preferred grid open area is about 33 percent.

In addition to screen 62, a positively biased d.c. probe is provided in order to produce an auxiliary plasma adjacent to substrate 30. The d.c. probe 64 is powered by a d.c. probe supply 66. The d.c. probe 64 may be a ring or other conventional shape.

The temperature at which the process is carried out can be any of the temperatures conventionally used in magnetron sputtering. The apparatus is particularly well suited for treating materials which have a relatively low softening or decomposition temperature such as certain plastic substrates. When treating such substrates, temperatures of below about 50° C. are preferred. The apparatus is also well suited for coating relatively large substrates with surfaces of one square foot and larger because the wire grid provides uniform dispersion of the sputtered target material.

As will be demonstrated in the following examples, it was discovered that there is a relationship between properties of the deposited film and the amount of voltage applied to the d.c. probe 64 and the open area of grid 62. The combination of d.c. probe 64 and grid 62 provides control over the deposition of sputtered materials which has not been previously possible with conventional techniques. The examples of practice are as follows:

EXAMPLE 1

An apparatus as shown in FIG. 1 was used to synthesize films of indium tin oxide. A 24 inch diameter stainless steel bell jar system was pumped by a six inch diffusion pump which was backed by a rotary pump. Oxygen and Argon were used as process gases and their proportion was controlled using flow tubes (MM1 and MM2 steel ball boats, Air Products). Argon was introduced near the target inside the mini-chamber. The mini-chamber had a six inch diameter and was one inch high. A perpendicular grid of stainless steel wires having a diameter of 0.018 inch and an open area of 33 percent was used to cover the mini-chamber. All the films were deposited at a pressure of one micron obtained by throttling the diffusion pump.

A magnetron cathode was used to sputter indium-15% tin alloy. The cathode was powered by a programmable 5 kilowatt d.c. power supply (R.F. Plasma Products Model SPS 5,000) which was operated in the constant power mode. The films were deposited onto glass substrates (microscope slides) mounted at a distance of ten inches above the target. Films were also deposited onto 12 inch×12 inch polymeric substrates under optimum deposition conditions to demonstrate the feasibility of the process to uniformly coat large area heat-sensitive substrates. Film thickness was measured using a Dektak surface profilometer. The UV-visible transmission of the films was recorded on a H.P. spectrophotometer. Sheet resistance and Hall mobility of the films were determined using the standard Van Der Paw technique. The wire grid was cleaned after every run by oxidizing the metal deposited on it. Some of the oxide spalls off on cooling and the rest is readily removed by wire brushing.

The operating parameters for this example are summarized in Table I.

TABLE I

Operating parameters used for synthesis of Indium Tin Oxide (ITO) films

| | |
|---|---|
| Chamber pressure | $1 \times 10^{-3}$ torr |
| Gas ratio | 25% $O_2$ - 75% Ar |
| Target power (constant power mode) | 250 W |
| Substrate temperature | Room Temperature to 30° C. |
| Probe potential | 0 to 125 V |
| Substrate potential | floating |
| Grid height with respect to target surface | 1 inch |
| Probe height with respect to target surface | 6 inch |
| Substrate height with respect to target surface | 10 inch |
| Open grid area | 33% |

The deposition rate as well as film properties, such as resistivity and optical transmission under varying conditions of d.c. probe voltage are shown in Table II.

TABLE II

Effect of d.c. probe voltage on deposition rate, electrical resistivity and optical transmission of the Indium Tin Oxide films

| Probe Voltage (V) | Current (mA) | Deposition Rate (A/s) | Resistivity* (ohm-cm) | Trans % |
|---|---|---|---|---|
| 75 | 290 | 1.6 | $4.3 \times 10^{-3}$ | 55.4 |
| 100 | 400 | 1.6 | $6.5 \times 10^{-4}$ | 81.8 |
| 115 | 450 | 1.6 | $7.0 \times 10^{-4}$ | 84.4 |
| 125 | 480 | 1.6 | $9.6 \times 10^{-4}$ | 86.2 |

*Resistivity calculated as $\rho$ = thickness × sheet resistance.

It should be noted that for a given target power, percent oxygen in the gas and percent open grid area, that the deposition rate remains constant with varying d.c. probe voltage. However, the resistivity and transmission of the films show a marked dependence on the probe voltage. This observation shows a unique feature of this apparatus in that one can vary and control the electrical, as well as optical properties of the film via the d.c. probe voltage without affecting the deposition rate. This is an important consideration in commercial applications.

The effect of probe voltage on film transmission is shown in FIG. 2. As can be seen, the transmission of the film increases with increasing probe voltage from 75 to 125 volts. Ionization efficiency is known to increase with electron energy, then go through a maximum in the range of 120–150 eV and then decrease rapidly. Therefore, it is likely that an increase in ionization due to increase in electron energy (with increase in d.c. probe potential) in this voltage range, enhances the oxidation of the growing film thereby improving its visible transmission.

FIG. 3 shows the variation in room temperature resistivity, carrier concentration and mobility of the films with variation in d.c. probe voltage. As can be seen from FIG. 3, the resistivity passes through a broad minimum with increases in d.c. probe voltage (other parameters being constant). Also, an increase in mobility is observed in the similar range of voltages. Thus, for a given operating condition, one can use the d.c. probe to optimize the optical and electrical properties of the films without sacrificing the rate of deposition. This provides the ability to control film properties by simply varying the d.c. probe voltage while maintaining the more critical and sensitive parameters, (such as percent oxygen and target power) constant. Accordingly, for a given cathode power, percent oxygen and percent open grid area, one can fabricate metallic films and change them to non-stoichiometric oxide films with the desired optical and electrical properties by varying the d.c. probe voltage.

It is difficult to provide a quantitative model of film growth to illustrate the complex manner in which all the above process variables interact. However, a simplistic explanation can be extended if one assumes that the chemical reactions in the vicinity of the surface of the growing film ultimately control the film properties. If this is true, then the auxiliary plasma present near the substrate in this process would be a crucial factor in controlling the film properties. And therefore, the process parameters which directly influence the auxiliary plasma will produce a marked effect on the film properties. It is in this respect that one has to consider the complimentary roles played by the grid covering the mini-chamber and the d.c. probe used in this process.

Since the ionization cross section (hence the auxiliary plasma intensity) is a function of electron number density and electron energy distribution function, any factor affecting either would show a corresponding effect on the plasma. For a given target power and pressure, the percent open area controls the electron number density escaping the cathode and the d.c. probe voltage controls the electron energy. It is believed that for this reason it is necessary to optimize the above two variables, i.e. the percent open area of the grid and the probe voltage (other conditions being constant) to obtain films with desirable electrical and optical properties. Thus for a given grid open area, target power and pressure, probe voltages between zero and a certain critical value would lead to films that are metallic in nature, because the auxiliary plasma cannot be sustained at these low voltages. However, the critical probe voltage can be decreased with an increase in percent open area of the grid used i.e. the auxiliary plasma and resultant oxide deposition can be achieved at lower and lower voltages since more electrons can escape from the cathode plasma or glow discharge.

EXAMPLE 2

Figure 4:
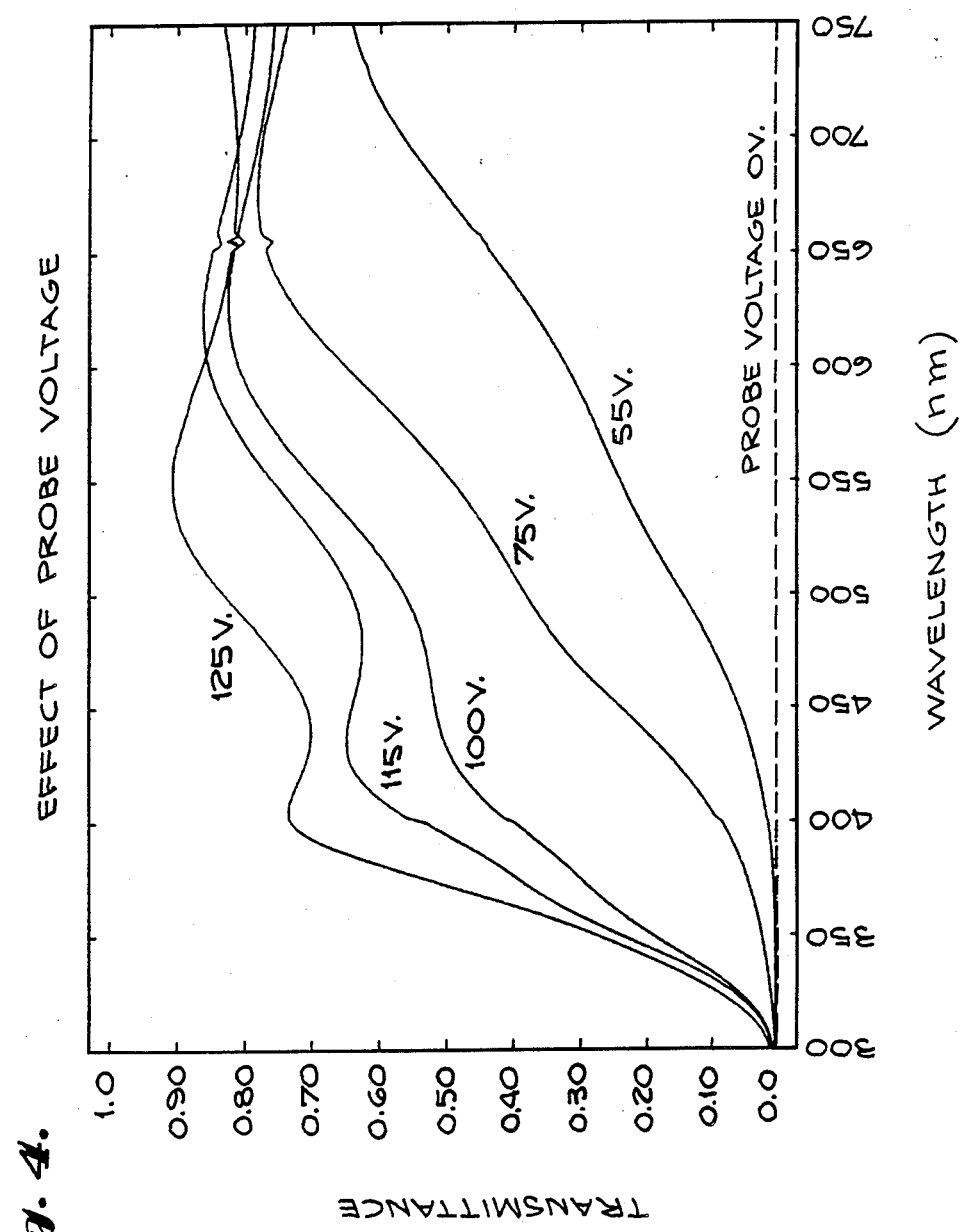
FIG. 4 depicts the effect of d.c. probe voltage on the transmission of the deposited film when used in combination with a wire grid having an open area of 22 percent.

Sputtering of an indium −15% tin alloy was conducted using the same parameters as in Example 1 except that the open grid area was decreased to 22 percent. The effect of probe voltage on transmittance of the resulting indium tin oxide film for voltages ranging from 45 to 115 volts are set forth in FIG. 4. Again, the results demonstrate that the properties of the deposited film can be varied simply and conveniently by regulating the d.c. probe voltage for a given grid open area.

EXAMPLE 3

Films were deposited on a glass substrate according to the parameters set forth in Table I except that the target power was 350 w, the d.c. probe voltage was maintained constant at 100 volts and the grid open area was 41 percent. The resulting indium tin oxide film had a sheet resistance as low as 8 ohms per square with integrated optical transmission better than 85 percent. The deposition rate was as high as 4 angstroms per second. Films were also deposited under the above conditions onto a 12 inch×12 inch polymeric substrate held stationary at about 10 inches from the target. Sheet resistance values in the range of 8–20 ohms per square and optical transmission of greater than 85 percent were obtained for these films.

Films were reproducibly deposited in accordance with the above examples onto 12 inch×12 inch plastic substrates. At optimum d.c. probe voltages, the films had resistivities of $6\times10^{-4}$ ohm-cm with corresponding carrier concentration of $3\times10^{20}$ cm$^{-3}$, and Hall mobility as high as 40 cm$^2$/V.S.

As is apparent from the foregoing examples, the combined use of a wire grid placed over the target material in combination with a d.c. probe to generate an auxiliary plasma near the substrate provides a simple and commercially valuable means for controlling the reactive magnetron sputtering process to optimize film properties without poisoning the target or otherwise adversely affecting the film deposition rate.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

BIBLIOGRAPHY

1. K. L. Chopra and I. Kaur, in "Thin Film Devices and Applications", Plenum Press, N.Y., 1983.
2. L. A. Rykara, V. S. Salun and I. A. Serbinov, *Thin Solid Films*, 92, 327, 1982.
3. G. Groth, *Phys. Stat. Solid*, 14, 69, 1969.
4. A. Mjorstsberg, I. Hamberg and C. G. Granquist, *Thin Solid Films*, 90, 323, 1980.
5. P. Nath and R. F. Bunshah, *Thin Solid Films*, 69, 63, 1980.
6. J. C. C. Fan, F. J. Bachner, *Appl. Phys. Lett.*, 31, 773, 1977.
7. E. Giani and R. Kelly, *J. Electrochem Soc.*, 121, 992, 1960.
8. J. Heller, *Thin Solid Films*, 17, 163, 1973.
9. K. G. Gerathy and L. F. Donaghey, *J. Electrochem. Soc.*, 123, 1201, 1976.
10. T. Abe and T. Yamashina, *Thin Solid Films*, 30, 19, 1975.
11. S. Schiller, V. Heisig, K. Stinfelder and J. Strumpfer, *Thin Solid Films*, 64, 455, 1979.
12. S. Maniv, C. Miner and W. D. Westwood, *Jour. Vac. Sci. Technol.* 18(2), 195, 1981.
13. S. Maniv, C. Miner and W. D. Westwood, *Jour. Vac. Sci. Technol.* 18(1), 1370, 1983.
14. M. Sererer and P. Wirz, *Thin Solid Films*, 119, 203, 1984.

What is claimed is:

1. An apparatus for depositing a thin film onto a substrate by reactive magnetron sputtering, said apparatus comprising:

a vacuum container which defines a vacuum chamber in which said substrate may be placed;

a magnetron cathode adapted to mount a layer of target material for sputtering to form a primary sputtering plasma at said magnetron cathode;

a layer of target material mounted on said magnetron cathode, said target material layer defining a surface area; means for directing the sputtered material formed by said primary sputtering plasma toward said substrate, said means for directing sputtered material comprising sidewalls surrounding said target material and extending upward from said magnetron cathode, said sidewalls defining a mini-chamber having an open top and open bottom;

a grid covering the open top of said mini-chamber for controlling the flow of sputtered material toward said substrate, said grid being electrically grounded and extending fully between said sidewalls of said mini-chamber;

inert gas means for introducing an inert gas into said mini-chamber;

reactive gas means for introducing a reactive gas adjacent to said substrate; and means for creating an auxiliary plasma adjacent to said substrate comprising a direct current probe having a positive bias wherein the combination of the auxiliary plasma and grid provides for deposition of a thin film onto said substrate.

2. An apparatus according to claim 1 wherein said grid comprises a metal wire grid having a grid open area of between about 20 percent to 45 percent.

3. An apparatus according to claim 2 wherein said grid open area is about 33 percent.

4. An apparatus according to claim 2 wherein said wire grid comprises wires having a diameter of less than 0.02 inch.

5. An apparatus according to claim 2 wherein said wire grid is made from stainless steel.

6. An apparatus according to claim 1 wherein said grid is located about one inch above the target material.

7. A process for depositing a thin film onto a substrate by reactive magnetron sputtering comprising the steps of:

producing a primary plasma including material which is sputtered from a target material by magnetron sputtering said target material comprising a target material layer;

controlling the flow of said sputtered material toward said substrate by placing a grid between said substrate and primary plasma, said grid being electrically grounded, located adjacent to said primary plasma and extending fully over the area of said target material layer;

producing an auxiliary plasma including said sputtered material adjacent to said substrate, said auxiliary plasma being produced by a d.c. probe having a variable positive bias; and introducing a reactive gas adjacent to said substrate for reaction with said sputtered material and deposition onto said substrate wherein a thin film is deposited onto said substrate over an area greater than the area of said target material layer.

8. A process according to claim 7 wherein said target material is selected from the group consisting of tin, indium, cadmium, zinc, aluminum, titanium and their alloys.

9. A process according to claim 8 wherein said reactive gas is selected from the group consisting of oxygen, nitrogen, halide gases including fluorine; silanes; germanes; phosphine; sulfur containing gases including hydrogen sulfide; and hydrocarbon gases.

10. A process according to claim 9 wherein said target material is an indium tin alloy and said reactive gas is oxygen.

11. A process according to claim 7 wherein said grid has an open area of between about 20 percent to about 45 percent.

12. A process according to claim 7 wherein target poisoning is reduced by providing a mini-chamber surrounding said target material, said mini-chamber having said wire grid as the top thereof and by introducing an inert gas into said mini-chamber.

13. A process according to claim 7 wherein said grid is located about 1 inch above said target material.

14. A process according to claim 11 wherein said grid is made from stainless steel wire having a diameter of less than 0.02 inch.

15. A process according to claim 7 wherein said substrate is a plastic material.

16. A process according to claim 7 wherein said process is conducted at a temperature of below about 50° C.

* * * * *